United States Patent
Bulacio et al.

(10) Patent No.: US 11,256,288 B1
(45) Date of Patent: Feb. 22, 2022

(54) CLOCK MONITORING USING A SWITCHED CAPACITOR

(71) Applicant: Allegro MicroSystems, LLC, Manchester, NH (US)

(72) Inventors: Matias Fernando Bulacio, Buenos Aires (AR); Nicolás Ronis, Buenos Aires (AR); Franco Noel Martin Pirchio, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/164,951

(22) Filed: Feb. 2, 2021

(51) Int. Cl.
*G06F 1/14* (2006.01)
*H03L 7/097* (2006.01)

(52) U.S. Cl.
CPC .............. *G06F 1/14* (2013.01); *H03L 7/097* (2013.01)

(58) Field of Classification Search
CPC ................................. G06F 1/14; H03L 7/097
USPC ......................................................... 327/337
See application file for complete search history.

(56) References Cited

U.S. PATENT DOCUMENTS

| | | | | |
|---|---|---|---|---|
| 4,982,116 A * | 1/1991 | Lee | ............................ | G06F 1/08 327/144 |
| 5,841,301 A * | 11/1998 | Horie | ..................... | H03K 5/086 327/100 |
| 7,746,181 B1 * | 6/2010 | Moyal | ....................... | H03L 7/18 331/44 |
| 7,990,209 B2 | 8/2011 | Romero | | |
| 8,049,568 B2 * | 11/2011 | Youssef | .................. | H03L 7/087 331/17 |
| 8,416,014 B2 | 4/2013 | Romero | | |
| 8,692,584 B2 * | 4/2014 | Nakamura | .............. | H03L 1/022 327/101 |
| 9,201,122 B2 | 12/2015 | Cesaretti et al. | | |
| 9,252,792 B2 * | 2/2016 | Thinakaran | .......... | H03L 7/0991 |
| 9,383,425 B2 | 7/2016 | Milano et al. | | |
| 9,455,721 B2 * | 9/2016 | J | .......................... | H03K 3/0231 |
| 9,503,106 B1 * | 11/2016 | Ding | ........................ | H03L 7/06 |
| 9,851,416 B2 | 12/2017 | Scheller et al. | | |
| 10,187,072 B1 * | 1/2019 | Chang | ..................... | H03L 7/183 |
| 10,527,703 B2 | 1/2020 | Monreal et al. | | |
| 10,635,130 B2 * | 4/2020 | Ensafdaran | .......... | H03K 5/1252 |
| 10,782,363 B2 | 9/2020 | Scheller et al. | | |
| 10,873,320 B2 | 12/2020 | Procházka | | |
| 2011/0057731 A1 * | 3/2011 | Youssef | .................... | H03L 7/07 331/10 |
| 2013/0093526 A1 * | 4/2013 | Ravinuthula | ........ | H03K 3/0315 331/57 |
| 2014/0002197 A1 * | 1/2014 | Patasani | .................... | H03L 7/02 331/8 |
| 2015/0326231 A1 * | 11/2015 | Thinakaran | .......... | H03K 3/0315 331/25 |

(Continued)

*Primary Examiner* — Ryan Jager
(74) *Attorney, Agent, or Firm* — Daly, Crowley, Mofford & Durkee, LLP (57) ABSTRACT

In one aspect, a clock monitor includes a frequency-to-voltage converter (FVC) configured to receive a clock signal and configured to generate a voltage signal in response to the clock signal received. The FVC includes a resistor and a switched capacitor (SC) circuit connected to the resistor to form a resister divider circuit. The switched capacitor circuit includes a capacitor. The clock monitor detects that a clock frequency is zero and/or the clock frequency is not within a frequency range.

32 Claims, 9 Drawing Sheets

(56) References Cited

U.S. PATENT DOCUMENTS

| | | | |
|---|---|---|---|
| 2016/0105187 A1* | 4/2016 | J ............................... | H03L 7/00 |
| | | | 331/36 C |
| 2017/0099011 A1* | 4/2017 | Freeman ................. | H02M 1/32 |
| 2018/0052558 A1* | 2/2018 | Wang ................... | H03K 17/955 |
| 2018/0091096 A1* | 3/2018 | Wu .......................... | H03B 5/24 |
| 2019/0235566 A1* | 8/2019 | Ensafdaran ........ | H03K 5/00006 |
| 2020/0366241 A1* | 11/2020 | Tsuji ....................... | H03L 7/091 |
| 2021/0111726 A1* | 4/2021 | Jang ......................... | G05F 1/59 |

* cited by examiner

CLOCK MONITORING USING A SWITCHED CAPACITOR

BACKGROUND

A clock (i.e., an oscillator) is provided in a circuit to provide a clock signal, for example, to synchronize signals. A clock monitor detects whether the clock signal provided by the clock is behaving as expected. Generally, a second clock is added to the circuit to assist in clock monitoring. For example, a first clock signal from a main clock is compared to a second clock signal from the second clock to detect any deviations in the clock frequency.

SUMMARY

In one aspect, a clock monitor includes a frequency-to-voltage converter (FVC) configured to receive a clock signal and configured to generate a voltage signal in response to the clock signal received. The FVC includes a resistor and a switched capacitor (SC) circuit connected to the resistor to form a resister divider circuit. The switched capacitor circuit includes a capacitor. The clock monitor detects that a clock frequency is zero and/or the clock frequency is not within a frequency range.

In another aspect, an integrated circuit (IC) includes a clock monitor that includes a frequency-to-voltage converter (FVC) configured to receive a clock signal and configured to generate a voltage signal in response to the clock signal received. The FVC includes a resistor; and a switched capacitor (SC) circuit connected to the resistor to form a resister divider circuit, wherein the switched capacitor circuit comprises a capacitor. The clock monitor also includes a comparator circuit configured to receive a signal from the SC circuit and a low pass filter connected to the SC circuit and to the comparator circuit. The clock monitor detects that a clock frequency is zero and/or the clock frequency is not within a frequency range.

One or more of the aspects above can include one or more of the following features. The clock monitor can further include a comparator circuit configured to receive a signal from the SC circuit and an equivalent resistance of the SC circuit at an expected clock frequency can enable the output voltage of the switched capacitor to be below a threshold voltage of the comparator. The clock monitor can further include logic circuitry configured to receive an output of the comparator circuit and the equivalent resistance of the SC circuit at the expected clock frequency is a function of a supply voltage and the threshold voltage of the comparator circuit, so that there is no fault indication by the logic circuitry. The clock monitor can further include a low pass filter connected to the SC circuit and to the comparator circuit. The comparator circuit can be an inverter. The comparator circuit can be a two-band comparator. The filter can be a switched capacitor low pass filter (SCLPF). The SC circuit can further include a first set of switches and a second set of switches. The first and second switches can be complementary. The SC circuit can be a first SC circuit and the FVC can further include a second SC circuit. The second SC circuit can include a second capacitor, a third set of switches, and a fourth set of switches and the third and fourth switches can be complementary. The FVC can further include a transistor connected in parallel to the resistor. The transistor can be a p-type metal-oxide-semiconductor (PMOS) transistor. The resistor can be a first resistor and the FVC can further include a first inverter having an output connected to a gate of the transistor; a second inverter having an output connected to an input of the first inverter; and a low pass filter (LPF) having a first end connected to an input of the second inverter at a first end and having a second end connected to the second SC circuit and to a second resistor. The clock monitor can be part of an integrated circuit. The SC circuit can function as a pull-up resistor in the resistor divider circuit. The SC circuit can function as a pull-down resistor in the resistor divider circuit. The SC circuit can be between two resistive elements in series in the resistor divider circuit.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Described herein are techniques to fabricate a clock monitor. In one example, a clock monitor may be fabricated using a switched capacitor to determine whether an actual frequency $f_{aclk}$ of a clock signal from a clock (i.e., an oscillator) is performing within a frequency range of an expected frequency $f_{eclk}$ and/or whether the clock signal is stuck (i.e., not providing an oscillating signal or zero frequency (i.e., $f_{aclk}=0$)).

The techniques described herein enable a clock monitor to be fabricated in an integrated circuit (IC) such that the clock monitor uses a single clock thereby saving silicon area and limiting power consumption by not needing a second clock. The techniques described herein enable the clock monitor to be independent of a digital system on the IC.

The clock monitor described herein may be used in numerous applications. In one example, the clock monitor may be used in a sensor (e.g., a magnetic-field sensor).

Figure 1:
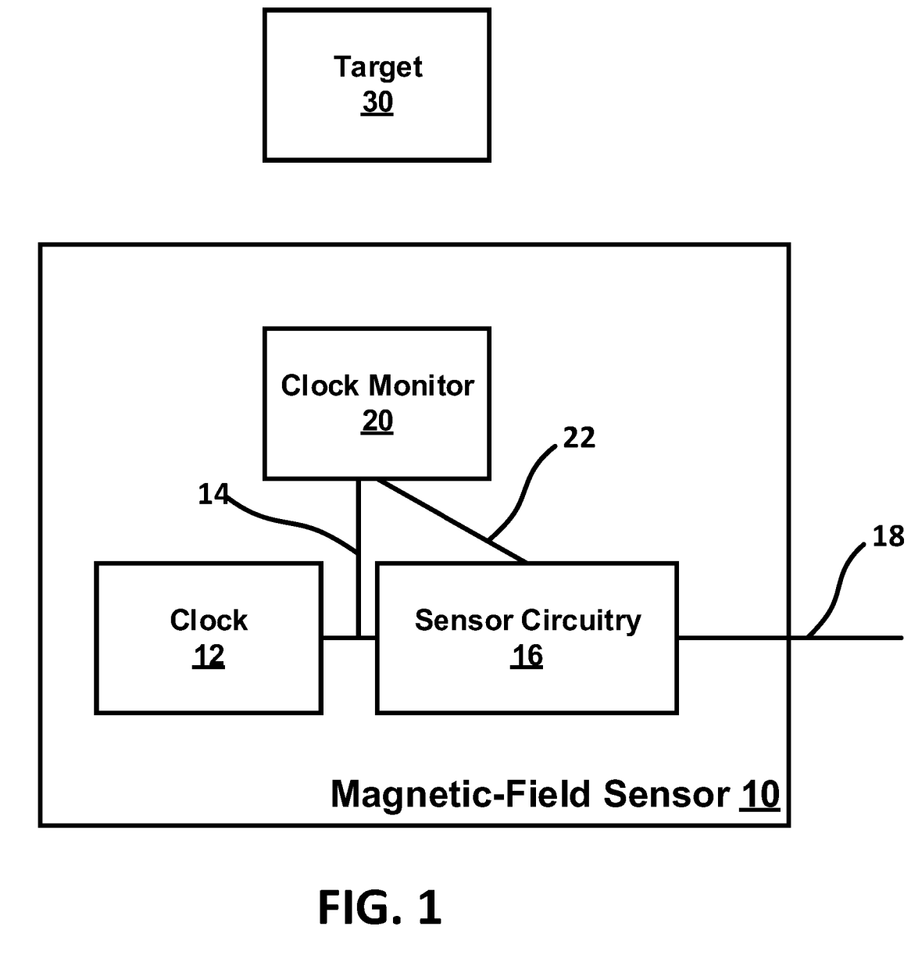
FIG. 1 is a block diagram of an example of a magnetic-field sensor that includes a clock monitor.

Referring to FIG. 1, a magnetic-field sensor 10 includes a clock 12 (i.e., an oscillator), a sensor circuitry 16 and a clock monitor 20. The sensor circuitry 16 senses a target 30. The sensor circuitry 16 uses a clock signal 14 provided by the clock 12 to enable the sensing of the target 30.

The clock monitor 20 receives the clock signal 14 and determines whether the clock 12 is performing properly. For example, the clock monitor 20 determines if the clock signal 14 is within a frequency range of the expected frequency $f_{eclk}$ and/or whether the clock signal 14 is stuck (i.e., not oscillating or has a zero frequency). The clock monitor 20 sends a signal 22 to the sensor circuitry 16 indicating whether the clock 12 is performing properly or not.

In other examples, the clock 12 may be located outside of the magnetic-field sensor 10. In other examples, the clock monitor 20 is part of the sensor circuitry 16. In some examples, the magnetic-field sensor 10 is fabricated on an IC.

As used herein, the term "magnetic-field sensor" is used to describe a circuit that uses a magnetic field sensing element (not shown), generally in combination with other circuits. Magnetic-field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic-field density of a magnetic field.

As used herein, the term "target" is used to describe an object to be sensed or detected by a magnetic-field sensor or a magnetoresistance element. The target 30 may include a conductive material that allows for eddy currents to flow within the target, for example a metallic target that conducts electricity.

Figure 2A:
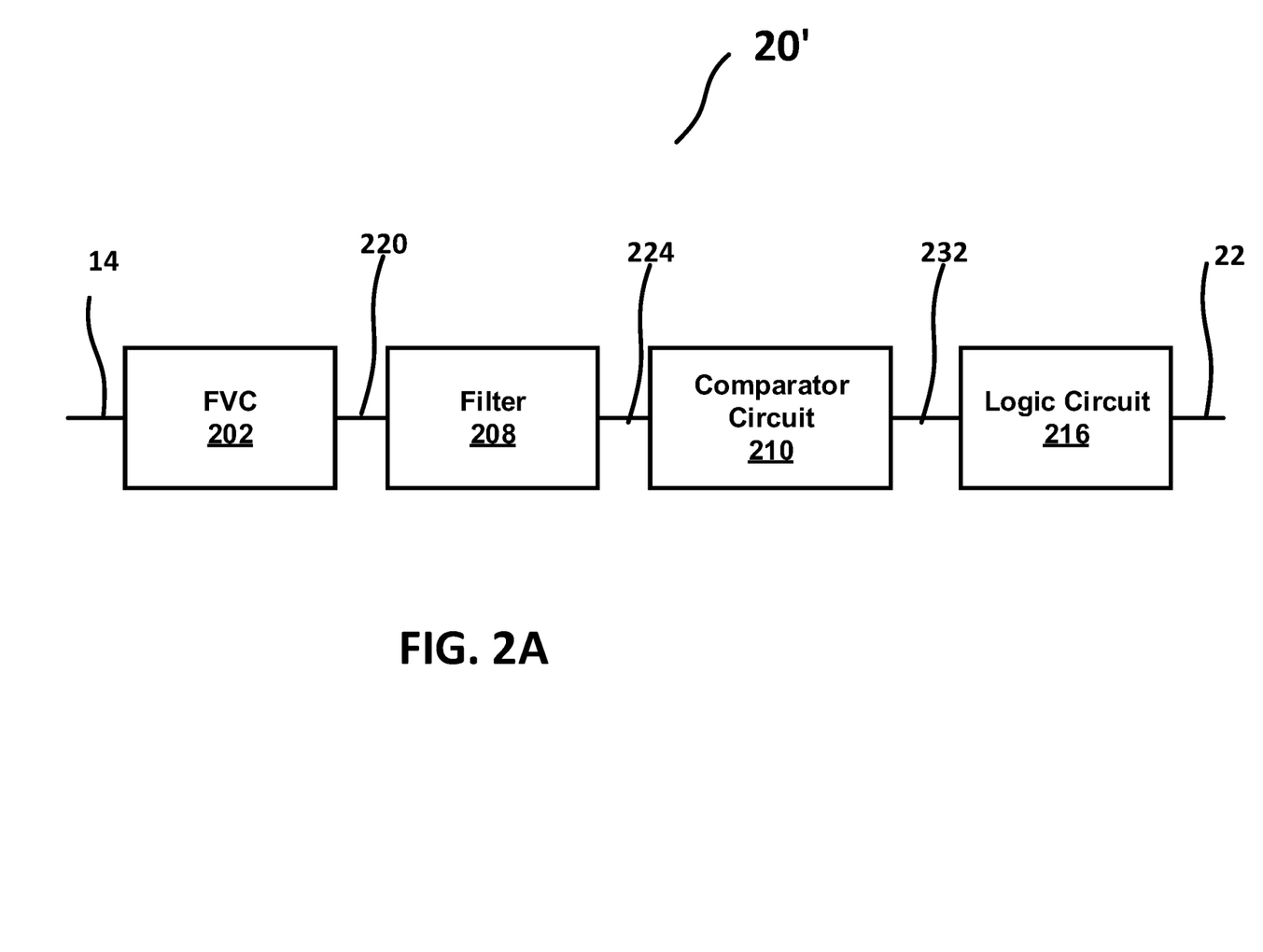
FIG. 2A is a diagram of an example of the clock monitor of FIG. 1 that includes a frequency-to-voltage converter (FVC) circuit.

Referring to FIG. 2A, an example of the clock monitor 20 (FIG. 1) is a clock monitor 20'. The clock monitor 20' includes a frequency-to-voltage converter (FVC) circuit 202, a filter 208, a comparator circuit 210 and a logic circuit 216.

The clock signal 14 is provided to the FVC 202, and the FVC 202 converts the clock signal 14 to a voltage signal 220. The voltage signal 220 is filtered by the filter 208. The filter 208 provides a filtered voltage signal 224 to the comparator circuit 210.

In one example, the comparator circuit 210 may determine if the filtered voltage signal 224 is within one or more parameters. In one example, the comparator circuit 210 may include a hysteresis to avoid chattering. The logic circuit 216 receives an output signal 232 from the comparator circuit 210 and generates the output signal 22 indicating whether the clock 12 (FIG. 1) is performing properly.

In some examples, the clock monitor 20' may not have a logic circuit 216, so that the output signal 22 is the same as the output signal 232. In still further examples, the comparator circuit includes logic circuit 216 components.

Figure 2B:
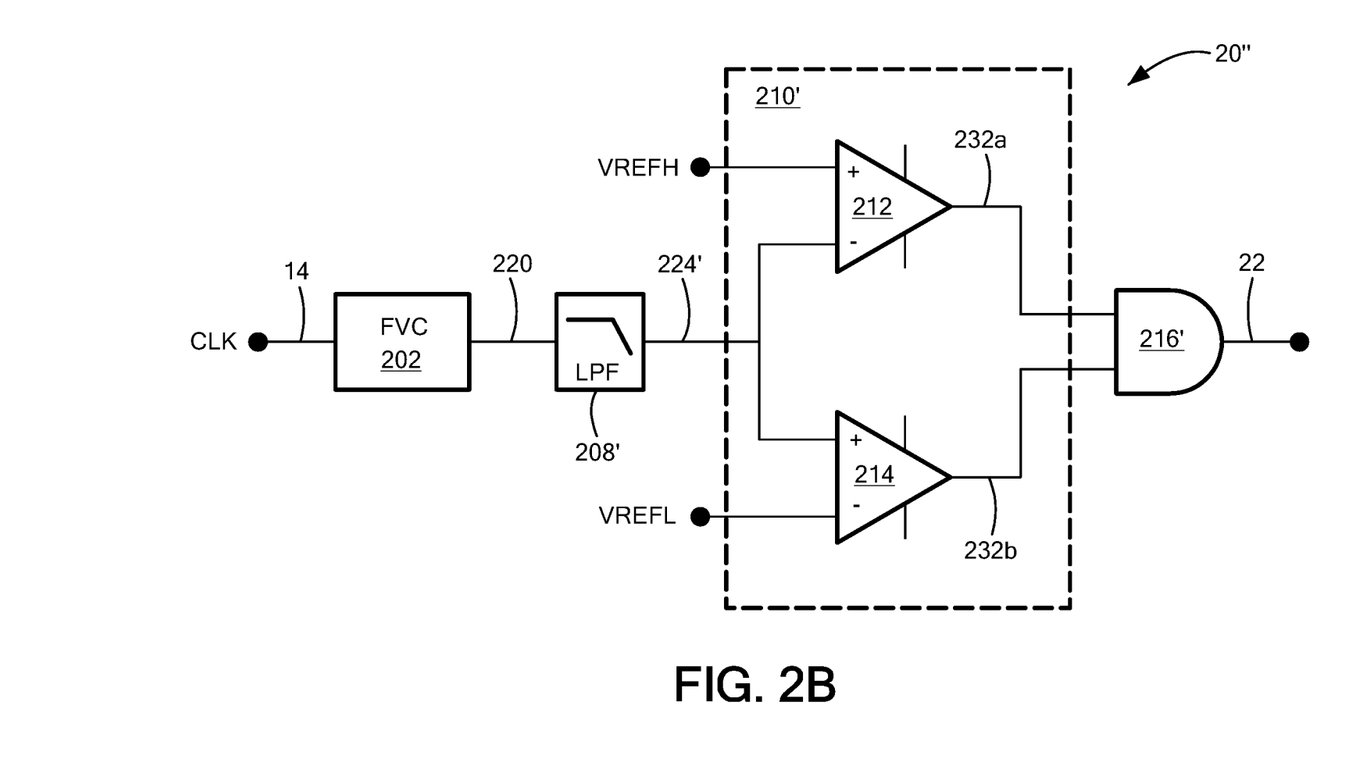
FIG. 2B is a circuit diagram of an example of the clock monitor of FIG. 2A.

Referring to FIG. 2B, an example of the clock monitor 20' (FIG. 1) is a clock monitor 20''. The clock monitor 20' determines whether the clock 12 (FIG. 1) is functioning within a frequency range of the expected frequency $f_{eclk}$.

The clock monitor 20' includes the FVC circuit 202, a low-pass filter (LPF) 208', a comparator circuit 210' and logic circuitry 216'. The LPF 208' is an example of the filter 208 (FIG. 2A), the comparator circuit 210' is an example of the comparator circuit 210 (FIG. 2A), and the logic circuitry 216' is an example of the logic circuitry 216 (FIG. 2A).

The clock signal 14 is provided to the FVC 202 and the FVC 202 converts the clock signal 14 to a voltage signal 220. The voltage signal 220 is filtered by the LPF 208. The LPF 208 provides a filtered voltage signal 224' to the comparator circuit 210.

The comparator circuit 210' may include a first comparator 212 and a second comparator 214. The filtered voltage signal 224' is provided to a negative input of the first comparator 212 and to a positive input of the second comparator 214. In some examples, the first comparator 212 and/or the second comparator 214 may include a hysteresis to avoid chattering.

In this example, the comparator circuit 210' determines if the filtered voltage 224' is between a high reference voltage VREFH and a low reference voltage VREFL. The high reference voltage VREFH corresponds with a high end of a desired frequency range, and the low reference voltage VREFL corresponds with a low end of the desired frequency range.

The first comparator 212 compares the filtered voltage signal 224' with the high reference voltage VREFH received at a positive input of the first comparator 212 and provides an output signal 232a. The second comparator 214 compares the filtered voltage signal 224' with the low reference voltage VREFL received at a negative input of the second comparator 214 and provides an output signal 232b.

In one example, if the filtered voltage signal 224' is less than the high reference voltage VREFH, then the output signal 232a is a logical high signal, and if the filtered voltage signal 224' is more than the high reference voltage VREFH, then the output signal 232a is a logical low signal.

If the filtered voltage 224' is greater than the low reference voltage VREFL, then the output signal 232b is a logical high signal, and if the filtered voltage 224' is lower than the low reference voltage VREFL, then the output signal 232b is a logical high signal.

The logic 216' receives the output signals 232a, 232b and generates the output signal 22. In one example, the logic 216' is a logical AND circuit. In one example, if both output signals 232a, 232b are logical high signals, then the output voltage 22 is a logical high voltage signal indicating that the clock signal 14 is performing within the desired frequency range; and if either of the output signals 232a, 232b are a logical low voltage signal, then the output voltage 22 is a logical low voltage signal indicating that the clock signal 14 is not performing within the desired frequency range.

Figure 3:
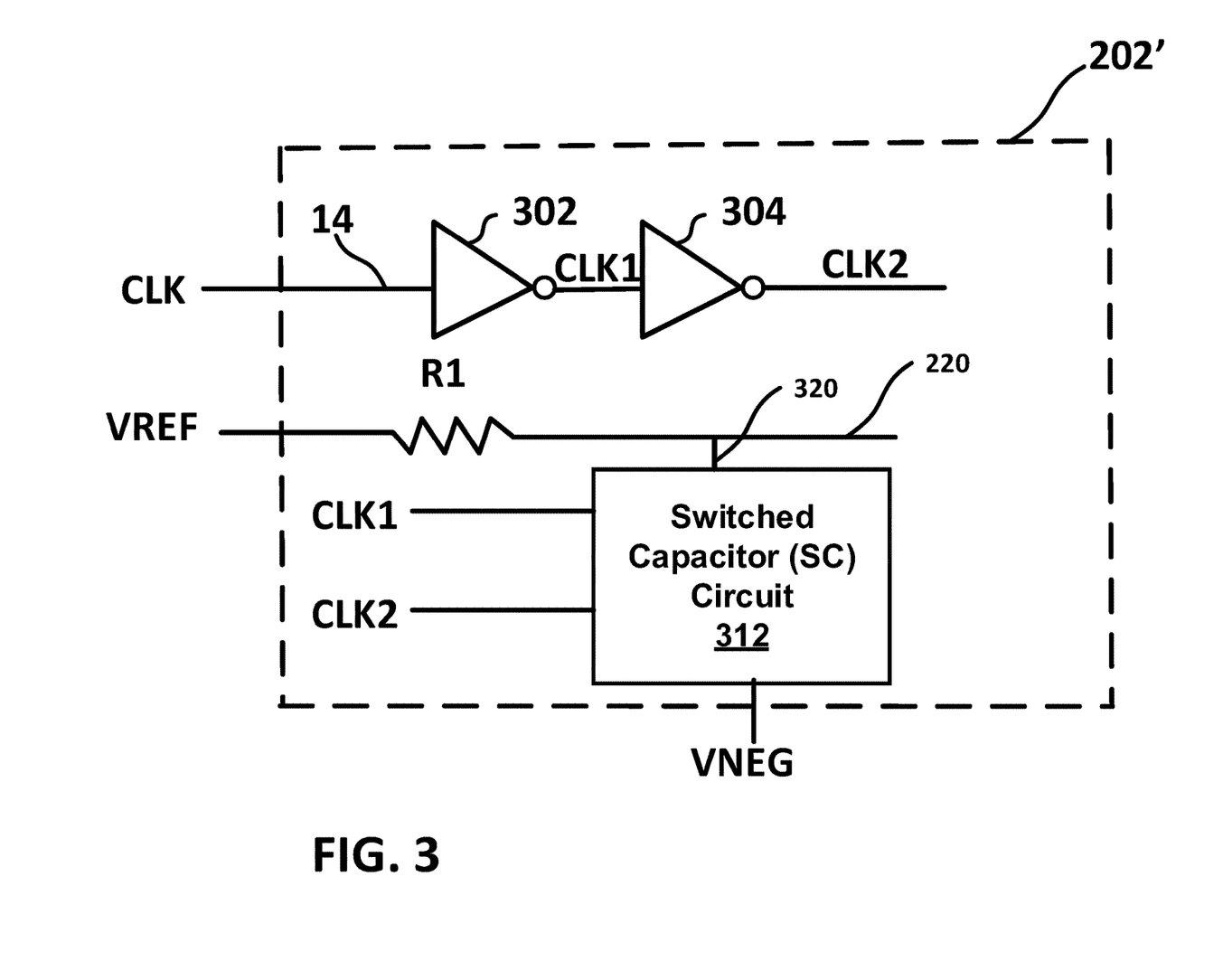
FIG. 3 is a block diagram of an example of the FVC circuit of FIG. 2A that includes a switched capacitor (SC) circuit.

Referring to FIG. 3, an example of the FVC circuit 202 (FIG. 2A) is FVC circuit 202'. The FVC circuit 202' includes a first resistor R1, a first inverter 302, a second inverter 304, and a switched capacitor (SC) circuit 312.

The first inverter 302 inverts the clock signal 14 to form a first clock signal CLK1. The second inverter 304 inverts the first clock signal CLK1 to form a second clock signal CLK2. As will be further described herein, although CLK and CLK2 have the same polarity, the second inverter 304 helps with the driving of switches (e.g., switches 412a and 412b (FIG. 4)) and, in addition, ensures similar rise and fall times between the two clock signals.

The SC circuit 312 is connected to the resistor R1 by a connection 320 and is connected to a voltage VNEG and an input 320. The SC circuit 312 receives the first and second clock signals CLK1, CLK2. Based on the first and second clock signals CLK1, CLK2, the SC circuit 312 forms the output signal 220.

A supply voltage signal VREF supplies a signal to the resistor R1 and to the SC circuit 312. The equivalent resistance of the SC circuit 312 is $R_{SC}$ and is configured so that $R_{SC} \ll R1$ at the expected frequency $f_{eclk}$. In one example, $R_{SC}$ is a function of a supply voltage VREF and voltage threshold(s) of the comparator circuit 210 (FIG. 2A), so that there is no fault indication by logic circuitry 216 (FIG. 2A) when operating at the expected frequency $f_{eclk}$.

The SC circuit 312 and the R1 form a resistor divider circuit. In one example, when the clock signal 14 is stuck, the first and second clock signals CLK1, CLK2 do not change and the SC circuit 312 becomes an open circuit. The voltage signal 220 becomes equal to the voltage supply signal VREF, which through further processing by the clock monitor (comparator circuit 220 and/or the logic circuit 216 (FIG. 2A)) can indicate an error.

Figure 4:
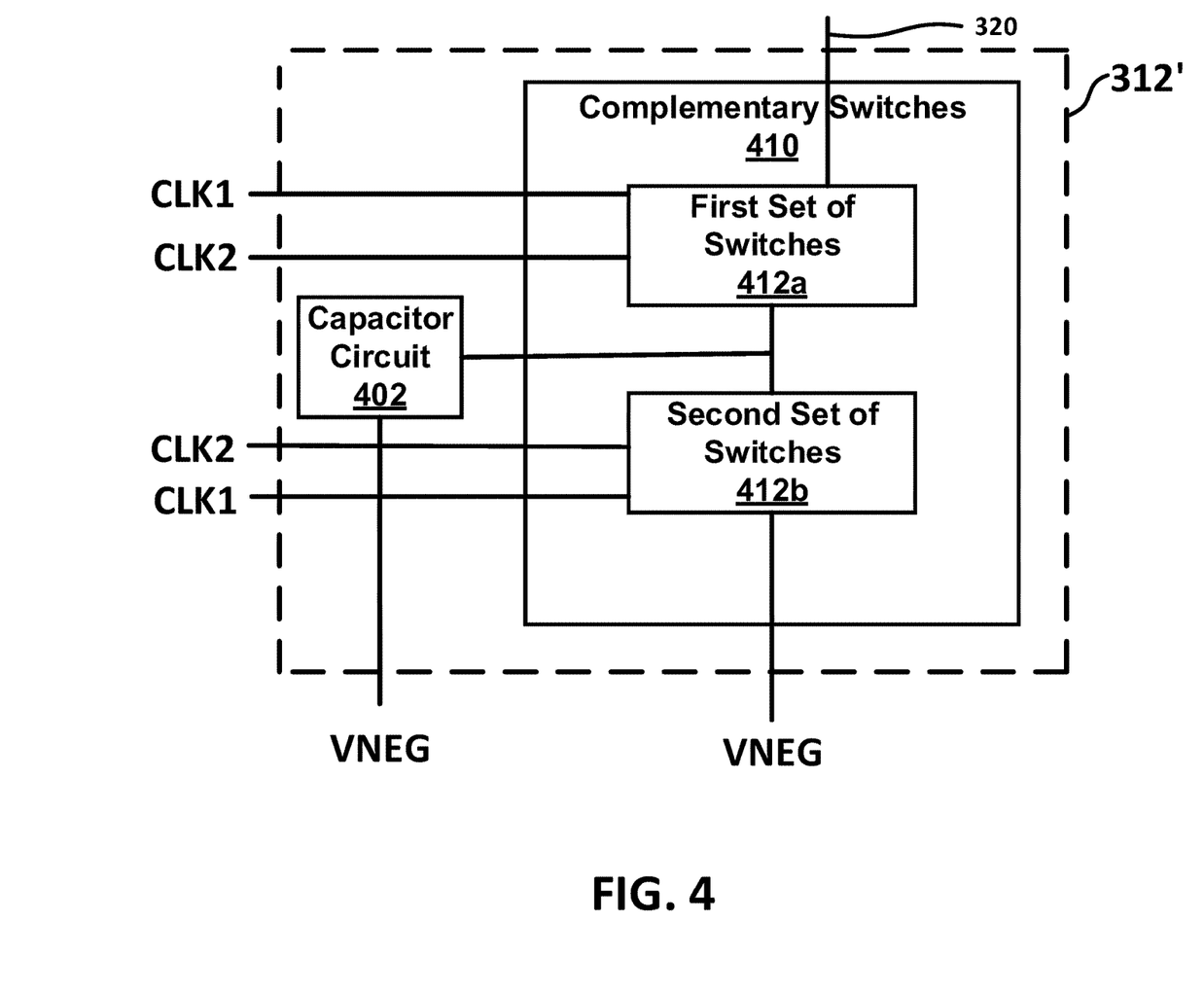
FIG. 4 is a block diagram of an example of the switched capacitor resistor (SC) circuit of FIG. 3 that includes complementary switches.

Referring to FIG. 4, an example of the SC circuit 312 (FIG. 3) is the SC circuit 312'. The SC circuit 312' includes a capacitor circuit 402 and complementary switches 410. The complementary switches 410 include a first set of switches 412a and a second set of switches 412b.

The capacitor circuit 402 is connected to the voltage VNEG and is connected to the first and second switches 412a, 412b. The second set of switches 412b is connected to the voltage VNEG.

In one example, the second set of switches 412b includes the same switches as the first set of switches 412a and the switches are configured in the same manner. Each switch in the first set of switches 412a is activated either by the first clock signal CLK1 or by the second clock signal CLK2. Each switch in the second set of switches 412b is activated either by the first clock signal CLK1 or by the second clock signal CLK2.

In one example, the number of switches in the first set of switches 412a activated by the first clock signal CLK1 is the same as the number of switches in the first set of switches 412a activated by the second clock signal CLK2. The number of switches in the second set of switches 412b activated by the first clock signal CLK1 is the same as the number of switches in the second set of switches 412b activated by the second clock signal CLK2.

In one example, if a switch in the first set of switches 412a is activated by the first clock signal CLK1, then the corresponding switch in the second set of switches 412b is activated by the second clock signal CLK2. Likewise, if a switch in the first set of switches 412a is activated by the second clock signal CLK2, then the corresponding switch in the second set of switches 412b is activated by the first clock signal CLK1.

Figure 5:
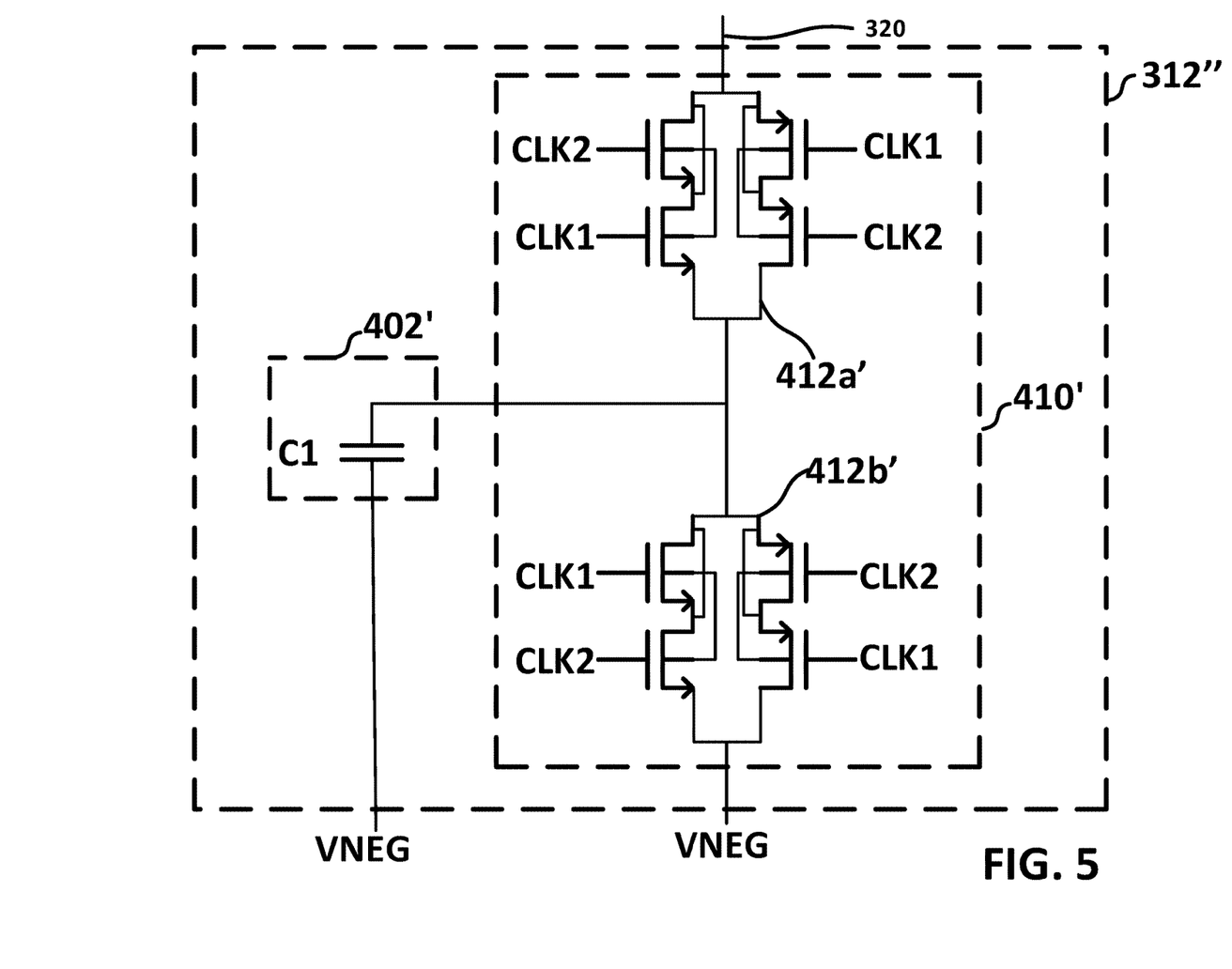
FIG. 5 is a circuit diagram of an example the SC circuit of FIG. 4.

Referring to FIG. 5, an example of the SC circuit 312' is the SC circuit 312" (FIG. 4). The SC circuit 312" includes a capacitor circuit 402' and complementary switches 410'. The capacitor circuit 402' is an example of the capacitor circuit 402 (FIG. 4) and includes a capacitor C1. The equivalent resistance of the switched capacitor circuit 312' $R_{SC}$ is equal to $1/(f_{aclk}*C1)$, where $f_{aclk}$ is the actual clock frequency.

In some examples, the expected clock frequency $f_{eclk}$ is in megahertz. In some examples, the capacitance of the capacitor C1 is selected so that $R_{SC} \ll R1$. In some examples, the capacitance of the capacitor C1 is selected such that when the clock is operating at the expected clock frequency $f_{eclk}$, the voltage signal 220 (FIG. 2A) is below the threshold voltage of the comparator circuit 210 (FIG. 2A)

If the actual clock frequency $f_{aclk}$ is zero, the equivalent resistance of the switched capacitor $R_{SC}$ is infinity and an open circuit is formed so that the voltage signal 22 is equal to the supply voltage VREF, which through circuitry (see, for example, comparator 210 and logic 216 in FIG. 2A) can indicate an error. As the actual clock frequency $f_{aclk}$ approaches infinity, $R_{SC}$ approaches zero, and therefore, the voltage signal 22 becomes zero, which through comparator 210 and logic 216 in FIG. 2A indicates an abnormal operation.

The complementary switches 410' is an example of complementary switches 410 (FIG. 4). The complementary switches 410' includes a first set of switches 412a' and a second set of switches 412b'.

The first set of switches 412a' is an example of the first set of switches 412a (FIG. 4) and the second set of switches 412b' is an example of the second set of switches 412b (FIG. 4). In this specific example, the first set of switches 412a' and the second set of switches 412b' each includes four transistors (e.g., two n-type metal-oxide-semiconductor field-effect (NMOS) transistors and two p-type metal-oxide-semiconductor field-effect (PMOS)).

Figure 6:
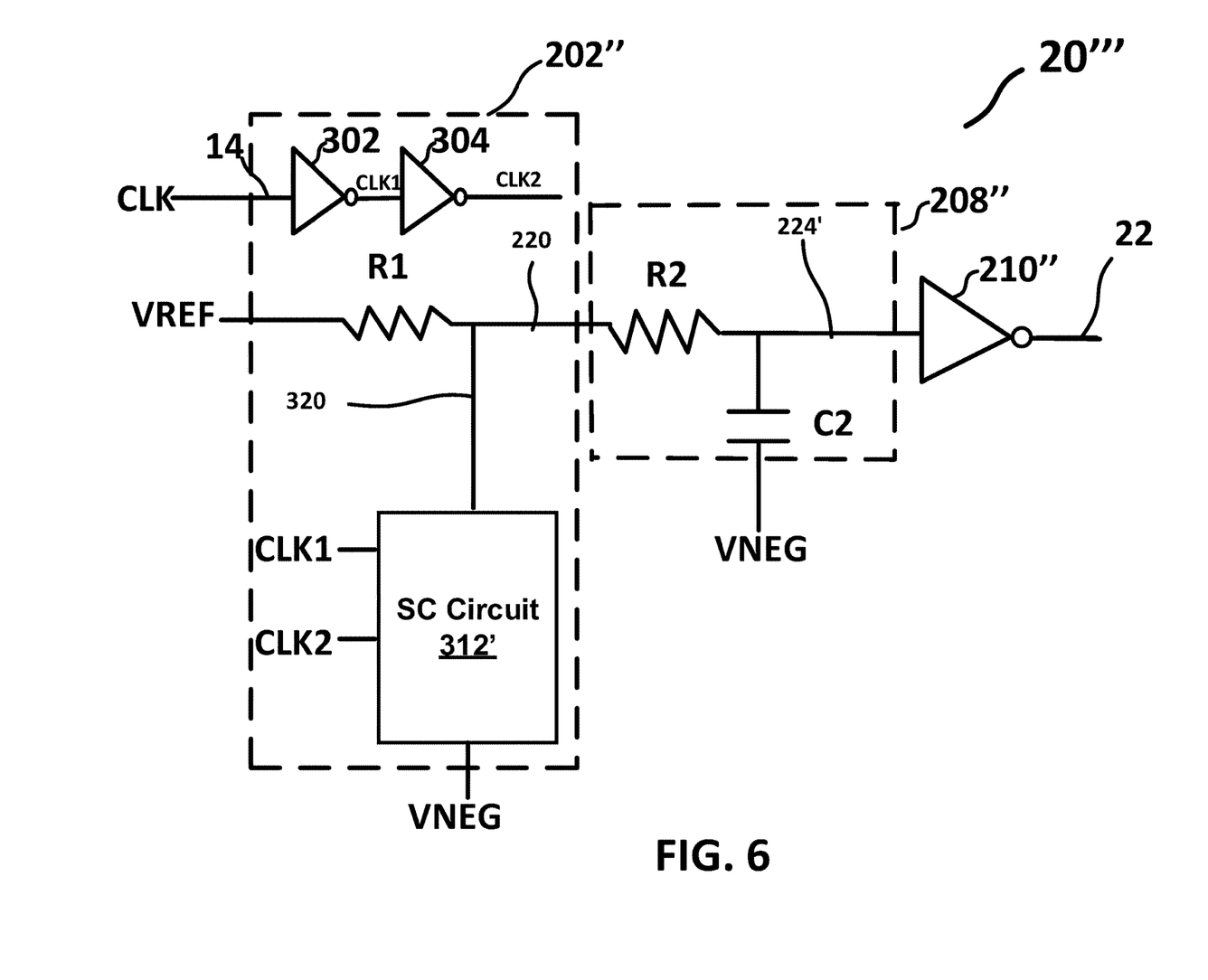
FIG. 6 is a circuit diagram of another example of the clock monitor with the SC circuit.

Referring to FIG. 6, another example of the clock monitor 20' (FIG. 2A) is a clock monitor circuit 20'''. In this configuration, the clock monitor circuit 20''' does not include the logic circuit 216'. The clock monitor 20''' determines whether the actual clock frequency is stuck (i.e., $f_{aclk}=0$). The clock monitor 20''' includes FVC 202'', a LPF 208'', a comparator circuit 210'' and logic circuitry 216'.

The FVC 202'' is an example of the FVC 202' (FIG. 3). The FVC 202'' includes the SC circuit 312' (FIG. 4).

The LPF 208'' is an example of the LPF 208' (FIG. 2B). The LPF 208' includes a resistor R2 and a capacitor C2 arranged in a typical LPF arrangement.

The comparator circuit 210'' is an example of the comparator circuit 210 (FIG. 2A). The comparator circuit 210'' is configured as an inverter and produces a signal 232'.

In one example, in operation, if the clock signal 14 is stuck, $f_{aclk}=0$, then the resistance $R_{SC}$ of the SC circuit approaches infinity and the SC circuit 312' forms an open circuit. With the open circuit, the voltage signal 220 is equal to the supply voltage VREF and is a logical high voltage signal. The filtered voltage signal 224' is also a logical high voltage signal.

The comparator circuit 210'' inverts the logical high signal to generate the output signal 22, which is a logical low voltage signal. The logical low voltage signal indicates, in this example, that the clock is malfunctioning.

In another example, in operation, if the clock signal 14 is working properly, that is the actual clock frequency $f_{aclk}$ is near the expected clock frequency $f_{eclk}$, then the resistance $R_{SC}$ of the SC circuit is much smaller than the resistor R1 and forms a closed circuit. With the closed circuit, the voltage signal 220 is much less than the supply voltage VREF and is a logical low voltage signal. The filtered voltage signal 224' is also a logical low voltage signal.

The comparator circuit 210'' inverts the logical low signal to generate an output signal 232'', which is a logical high voltage signal. The logical high voltage signal indicates, in this example, that the clock is operating normally.

In FIG. 6, the SC circuit 312' functions as a pull-down resistor in a resistor divider circuit. In other examples, R1 and SC 312' may be switched so that SC circuit 312' functions as a pull-up resistor in a resistor divider circuit. In this configuration, the output of the logic 216' when the clock is not stuck is a logical low voltage signal. Thus, in other examples, with the SC circuit 312', an inverter may be added after the logic circuit 216' so that the output of the added inverter is a logical high voltage signal.

In other examples, the SC circuit 312a may be between two resistive elements in series, in a resistor divider configuration. By being between the two resistive elements, the SC circuit 312a may be used in conjunction with a comparator circuit to measure differential signals to determine, for example, whether the actual clock frequency is outside a frequency range.

Figure 7:
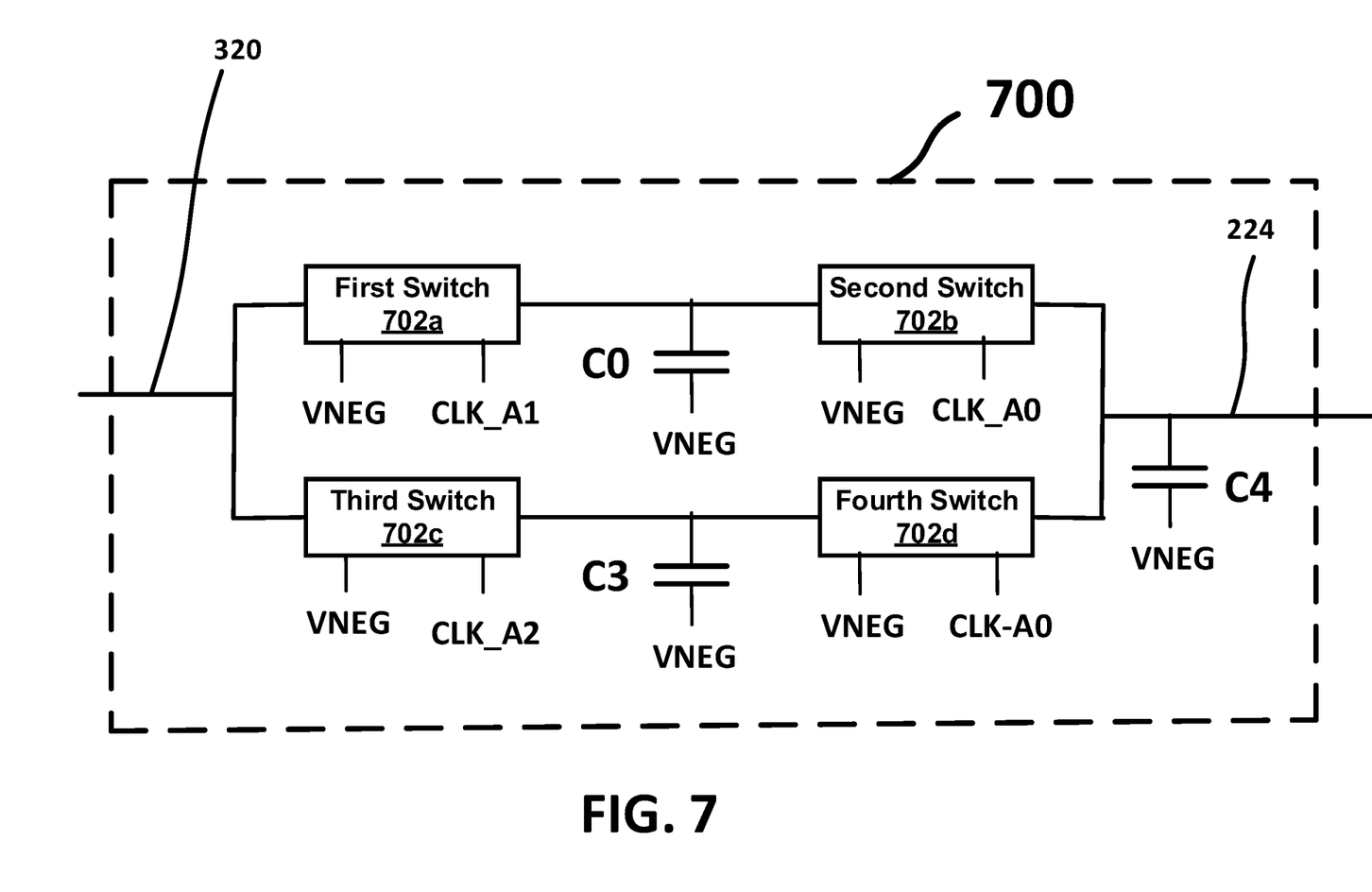
FIG. 7 is a circuit diagram of an example of a switched capacitor low pass filter (SCLPF)

Referring to FIG. 7, the clock monitor 20''' (FIG. 6) may be further modified to, for example, improve the functionality of a clock monitor for clock frequencies below 1 megahertz. For example, the comparator circuit 210' (FIG. 6) may be replaced with a two-band comparator (e.g., the comparator circuit 210' (FIG. 2B)). The SC circuit 312' (FIG. 6) and the LPF 208" may be replaced with a switched capacitor low pass filter (SCLPF) 700.

The SCLPF 700 includes a first switch 702a; a second switch 702b connected in series with the first switch; a third switch 702c in parallel with the first switch 702a; and a fourth switch 702d in series with the third switch 702c. The SCLPF 700 also includes a capacitor C0 connected to the first and second switches 702a, 702b and to the voltage VNEG; a capacitor C3 connected to the third and fourth switches 702c, 702d and to the voltage VNEG; and a capacitor C4 connected to the second and fourth switches 702b, 702d and to the voltage VNEG.

The first switch 702a is connected to a clock signal CLK_A1 and to the voltage VNEG. The third switch 702c is connected to a clock signal CLK_A2 and to the voltage VNEG. The second switch 702b and the fourth switch 702d are each connected to a clock signal CLK_A0 and to the voltage VNEG. In one example, the SCLPF 700 may be fabricated operated as a switched capacitor notch filter as described in U.S. Pat. No. 7,990,209, issued Aug. 2, 2011, titled "SWITCHED CAPACITOR NOTCH FILTER," which is assigned to the same assignee as this patent application.

Figure 8:
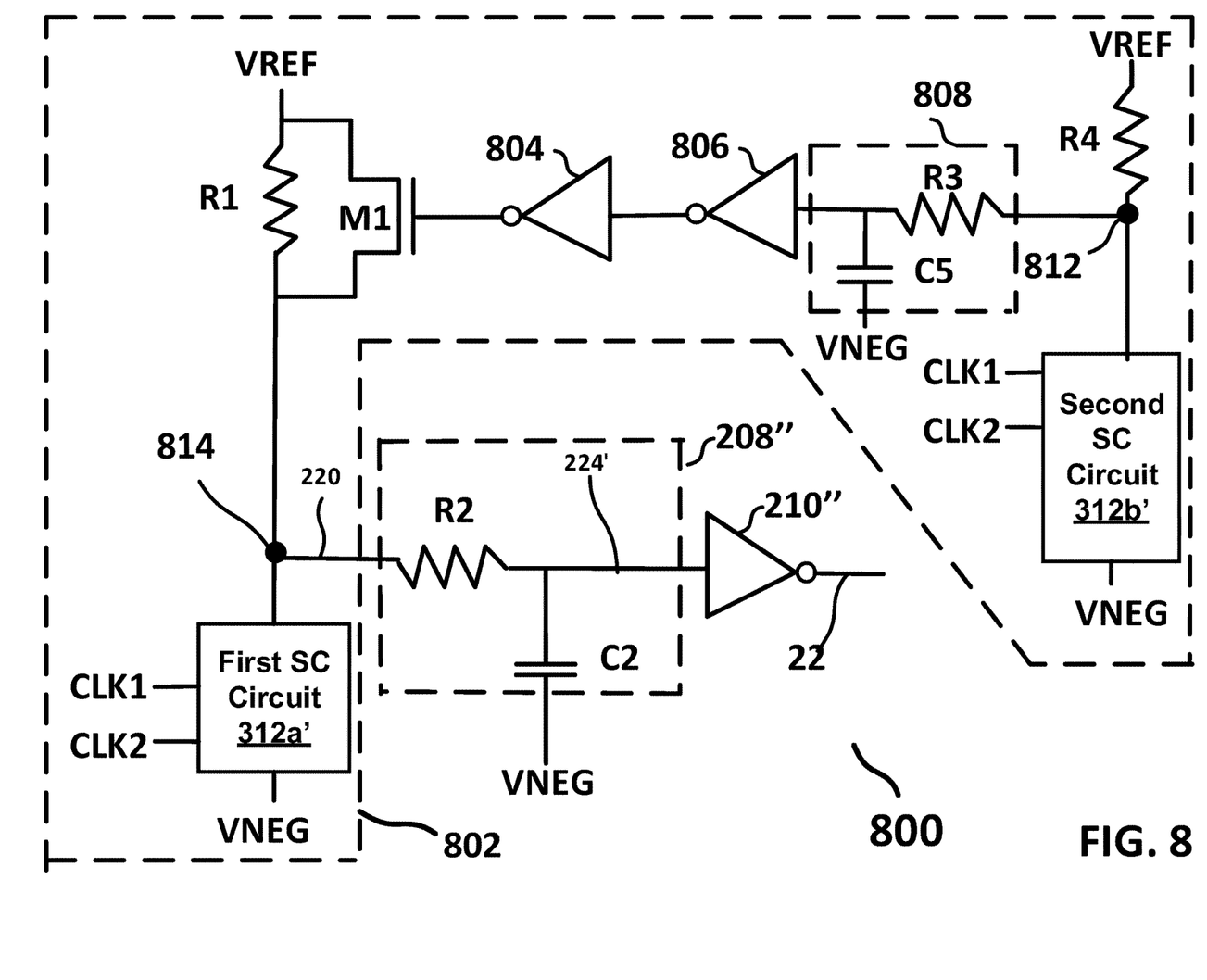
FIG. 8 is a circuit diagram of a further example of the clock monitor with two SC circuits.

Referring to FIG. 8, another example of the clock monitor 20' (FIG. 2A) is a clock monitor circuit 800. The clock monitor 800 determines whether the actual clock frequency is stuck (i.e., $f_{aclk}=0$) and determines whether the clock signal 14 (FIG. 2A) is within a frequency range of the expected frequency $f_{eclk}$.

The clock monitor 800 includes a FVC 802, the LPF 208", and the comparator circuit 210". The FVC 802 includes a first SC circuit 312a, the resistor R1, a transistor M1, an inverter 804, an inverter 806, a LPF 808, a second SC circuit 312b' and a resistor R4. The LPF 808 includes a capacitor C5 and a resistor R3.

The first inverter 804 has an output connected to a gate of the transistor M1. The second inverter has an output connected to an input of the first inverter 804. The LPF 808 has a first end connected to an input of the second inverter 806 and has a second end connected to the second SC circuit 312b' and to the resistor R4, which is connected to the voltage VREF.

In one example, the first and second SC circuits 312a' and 312b' may be the same as the SC circuit 312' (FIG. 4). In one example, the transistor M1 may be a PMOS transistor.

The clock monitor 800 includes two different resistor divider circuits and each resistor divider includes a SC circuit 312a' or 312b. The equivalent resistance of the first SC circuit 312a' is $R_{SC1}$ and the equivalent resistance of the second SC circuit 312b' is $R_{SC2}$.

At the expected frequency $f_{eclk}$, R1>>Rsc1 and Rsc2>>R4. A voltage at a node 812 is high enough to be detected as a logical high voltage signal, so that the transistor M1 will be in an "off" state. At a node 814, a voltage will be low enough to be detected as a logical low voltage signal by the comparator circuit 210" so that the output signal 22 is a logical high voltage signal indicating that the clock 12 (FIG. 1) is functioning normally.

If the clock 12 (FIG. 1) is stuck ($f_{aclk}=0$), then the first and second SC circuits 312a', 312b' are open circuits (i.e., Rsc1 and Rsc2 are infinity) and the voltage at the node 814 will be VREF or a logical high voltage signal, so that the output 22 will be a logical low voltage signal indicating a failure of the clock 12 (FIG. 1).

When the actual clock frequency $f_{aclk}$ is below the frequency range, Rsc1>>R1 and Rsc2>>R4. The voltage at the node 812 will be detected as a logical high voltage signal and the transistor M1 is in an 'off' state. The voltage at the node 814 is a logical high voltage signal so that the output 22 is a logical low voltage signal indicating a clock failure.

Also, when the actual clock frequency $f_{aclk}$ is above the frequency range, R1>>Rsc1 and Rsc2<<R4. The voltage at the node 812 will be detected as a logical low voltage signal and the transistor M1 is turned "on" and the resistor R1 is shorted out thereby forcing the voltage at the node 814 to be VREF or a logical high voltage signal. Thus, the output 22 is a logical low voltage signal indicating failure.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A clock monitor comprising:
   a frequency-to-voltage converter (FVC) configured to receive a first clock signal and configured to generate a voltage signal in response to the first clock signal received,
   wherein the FVC comprises:
      a first inverter configured to invert the first clock signal to form a second clock signal;
      a second inverter configured to invert the second clock signal to form a third clock signal;
      a resistor; and
      a switched capacitor (SC) circuit connected to the resistor to form a resister divider circuit, wherein the switched capacitor circuit comprises:
         a capacitor;
         a first set of switches comprising a first switch configured to receive the second clock signal, a second switch configured to receive the third clock signal, a third switch configured to receive the second clock signal, and a fourth switch configured to receive the third clock signal,
   wherein the clock monitor detects that a clock frequency of the first clock signal is zero and/or that the clock frequency of the first clock signal is not within a frequency range.

2. The clock monitor of claim 1, further comprising a comparator circuit configured to receive a signal from the SC circuit,
   wherein an equivalent resistance of the SC circuit at an expected clock frequency enables the output voltage of the SC circuit to be below a threshold voltage of the comparator circuit.

3. The clock monitor circuit of claim 2, further comprising a low pass filter connected to the SC circuit and to the comparator circuit.

4. The clock monitor circuit of claim 3, wherein the filter is a switched capacitor low pass filter (SCLPF).

5. The clock monitor of claim 1, wherein the SC circuit further comprises a second set of switches comprising a fifth switch configured to receive the second clock signal, a sixth switch configured to receive the third clock signal, a seventh switch configured to receive the second clock signal, and an eighth switch configured to receive the third clock signal.

6. The clock monitor of claim 5, wherein the first set of switches and the second set of switches are complementary.

7. The clock monitor of claim 5, wherein the SC circuit is a first SC circuit,
wherein the FVC further includes a second SC circuit.

8. The clock monitor of claim 5, wherein the FVC further comprises a transistor connected in parallel to the resistor.

9. The clock monitor of claim 8, wherein the transistor is a p-type metal-oxide-semiconductor (PMOS) transistor.

10. The clock monitor of claim 1, wherein the clock monitor is part of an integrated circuit.

11. The clock monitor of claim 1, wherein the SC circuit functions as a pull-up resistor in the resistor divider circuit.

12. The clock monitor of claim 1, wherein the SC circuit functions as a pull-down resistor in the resistor divider circuit.

13. The clock monitor of claim 1, wherein the SC circuit is between two resistive elements in series in the resistor divider circuit.

14. A clock monitor comprising:
a frequency-to-voltage converter (FVC) configured to receive a clock signal and configured to generate a voltage signal in response to the clock signal received, wherein the FVC comprises:
a resistor; and
a switched capacitor (SC) circuit connected to the resistor to form a resister divider circuit, wherein the switched capacitor circuit comprises a capacitor;
a comparator circuit configured to receive a signal from the SC circuit; and
logic circuitry configured to receive an output of the comparator circuit,
wherein an equivalent resistance of the SC circuit at an expected clock frequency enables the output voltage of the SC circuit to be below a threshold voltage of the comparator circuit,
wherein the equivalent resistance of the SC circuit at the expected clock frequency is a function of a supply voltage and the threshold voltage of the comparator circuit, so that there is no fault indication by the logic circuitry,
wherein the clock monitor detects that a clock frequency is zero and/or the clock frequency is not within a frequency range.

15. The clock monitor of claim 14, wherein the SC circuit functions as one of: a pull-up resistor in the resistor divider circuit, a pull-down resistor in the resistor divider circuit or is between two resistive elements in series in the resistor divider circuit.

16. A clock monitor comprising:
a frequency-to-voltage converter (FVC) configured to receive a clock signal and configured to generate a voltage signal in response to the clock signal received, wherein the FVC comprises:
a resistor; and
a switched capacitor (SC) circuit connected to the resistor to form a resister divider circuit, wherein the switched capacitor circuit comprises a capacitor; and
a comparator circuit configured to receive a signal from the SC circuit,
wherein an equivalent resistance of the SC circuit at an expected clock frequency enables the output voltage of the SC circuit to be below a threshold voltage of the comparator circuit,
wherein the comparator circuit is an inverter,
wherein the clock monitor detects that a clock frequency is zero and/or the clock frequency is not within a frequency range.

17. The clock monitor of claim 16, wherein the SC circuit functions as one of: a pull-up resistor in the resistor divider circuit, a pull-down resistor in the resistor divider circuit or is between two resistive elements in series in the resistor divider circuit.

18. A clock monitor comprising:
a frequency-to-voltage converter (FVC) configured to receive a clock signal and configured to generate a voltage signal in response to the clock signal received, wherein the FVC comprises:
a resistor; and
a switched capacitor (SC) circuit connected to the resistor to form a resister divider circuit, wherein the switched capacitor circuit comprises a capacitor; and
a comparator circuit configured to receive a signal from the SC circuit,
wherein an equivalent resistance of the SC circuit at an expected clock frequency enables the output voltage of the SC circuit to be below a threshold voltage of the comparator circuit,
wherein the comparator circuit is a two-band comparator,
wherein the clock monitor detects that a clock frequency is zero and/or the clock frequency is not within a frequency range.

19. The clock monitor of claim 18, wherein the SC circuit functions as one of: a pull-up resistor in the resistor divider circuit, a pull-down resistor in the resistor divider circuit or is between two resistive elements in series in the resistor divider circuit.

20. A clock monitor comprising:
a frequency-to-voltage converter (FVC) configured to receive a clock signal and configured to generate a voltage signal in response to the clock signal received, wherein the FVC comprises:
a resistor; and
a first switched capacitor (SC) circuit connected to the resistor to form a resister divider circuit, wherein the first SC circuit comprises:
a capacitor;
a first set of switches; and
a second set of switches; and
a second SC switch, wherein the second SC circuit comprises:
a second capacitor;
a third set of switches; and
a fourth set of switches,
wherein the first and second set of switches are complementary,
wherein the third and fourth set of switches are complementary,
wherein the clock monitor detects that a clock frequency is zero and/or the clock frequency is not within a frequency range.

21. The clock monitor of claim 20, wherein the first SC circuit functions as one of: a pull-up resistor in the resistor divider circuit, a pull-down resistor in the resistor divider circuit or is between two resistive elements in series in the resistor divider circuit.

22. A clock monitor comprising:
a frequency-to-voltage converter (FVC) configured to receive a clock signal and configured to generate a voltage signal in response to the clock signal received, wherein the FVC comprises:
   a first resistor;
   a p-type metal-oxide-semiconductor transistor connected in parallel to the first resistor; and
   a first switched capacitor (SC) circuit connected to the first resistor to form a resister divider circuit, wherein the first SC circuit comprises:
      a capacitor;
      a first set of switches; and
      a second set of switches;
   a second SC circuit,
wherein the clock monitor detects that a clock frequency is zero and/or the clock frequency is not within a frequency range,
wherein the FVC further comprises:
   a first inverter having an output connected to a gate of the transistor;
   a second inverter having an output connected to an input of the first inverter;
   a low pass filter (LPF) having a first end connected to an input of the second inverter at a first end and having a second end connected to the second SC circuit and to a second resistor.

23. The clock monitor of claim 22, wherein the first SC circuit functions as one of: a pull-up resistor in the resistor divider circuit, a pull-down resistor in the resistor divider circuit or is between two resistive elements in series in the resistor divider circuit.

24. An integrated circuit (IC), comprising:
a clock monitor comprising:
   a frequency-to-voltage converter (FVC) configured to receive a first clock signal and configured to generate a voltage signal in response to the first clock signal received, wherein the FVC comprises:
      a first inverter configured to invert the first clock signal to form a second clock signal;
      a second inverter configured to invert the second clock signal to form a third clock signal;
      a resistor; and
      a switched capacitor (SC) circuit connected to the resistor to form a resister divider circuit, wherein the switched capacitor circuit comprises:
         a capacitor; and
         a first set of switches comprising a first switch configured to receive the second clock signal, a second switch configured to receive the third clock signal, a third switch configured to receive the second clock signal, and a fourth switch configured to receive the third clock signal;
   a comparator circuit configured to receive a signal from the SC circuit; and
   a low pass filter connected to the SC circuit and to the comparator circuit,
wherein the clock monitor detects that a clock frequency of the first clock signal is zero and/or that the clock frequency of the first clock signal is not within a frequency range.

25. The IC of claim 24, wherein an equivalent resistance of the SC circuit at an expected clock frequency enables the output voltage of the SC circuit to be below a threshold voltage of the comparator circuit.

26. The IC of claim 24, wherein the SC circuit further comprises a first set of switches and a second set of switches, wherein the first and second switches are complementary.

27. The IC of claim 24, wherein the SC circuit functions as one of: a pull-up resistor in the resistor divider circuit, a pull-down resistor in the resistor divider circuit or is between two resistive elements in series in the resistor divider circuit.

28. An integrated circuit (IC), comprising:
a clock monitor comprising:
   a frequency-to-voltage converter (FVC) configured to receive a clock signal and configured to generate a voltage signal in response to the clock signal received, wherein the FVC comprises:
      a resistor; and
      a switched capacitor (SC) circuit connected to the resistor to form a resister divider circuit, wherein the switched capacitor circuit comprises a capacitor;
   a comparator circuit configured to receive a signal from the SC circuit; and
   a low pass filter connected to the SC circuit and to the comparator circuit,
wherein the clock monitor further comprises logic circuitry configured to receive an output of the comparator circuit,
wherein the equivalent resistance of the SC circuit at the expected clock frequency is a function of a supply voltage and the threshold voltage of the comparator circuit, so that there is no fault indication by the logic circuitry,
wherein the clock monitor detects that a clock frequency is zero and/or the clock frequency is not within a frequency range.

29. The IC of claim 28, wherein the SC circuit functions as one of: a pull-up resistor in the resistor divider circuit, a pull-down resistor in the resistor divider circuit or is between two resistive elements in series in the resistor divider circuit.

30. An integrated circuit (IC), comprising:
a clock monitor comprising:
   a frequency-to-voltage converter (FVC) configured to receive a clock signal and configured to generate a voltage signal in response to the clock signal received, wherein the FVC comprises:
      a resistor; and
      a first switched capacitor (SC) circuit connected to the resistor to form a resister divider circuit, wherein the first SC circuit comprises:
         a capacitor;
         a first set of switches; and
         a second set of switches, wherein the first set of switches and the second set of switches are complementary;
   a comparator circuit configured to receive a signal from the first SC circuit; and
   a low pass filter connected to the first SC circuit and to the comparator circuit,
wherein the clock monitor further comprises logic circuitry configured to receive an output of the comparator circuit,
wherein the FVC further includes a second SC circuit, the second SC circuit comprises:

a transistor connected in parallel to the resistor;
a second capacitor;
a third set of switches; and
a fourth set of switches,
wherein the third set of switches and the fourth set of switches are complementary,
wherein the clock monitor detects that a clock frequency is zero and/or the clock frequency is not within a frequency range.

31. The IC of claim 30, wherein the resistor is a first resistor,
wherein the SC circuit is the first SC circuit,
wherein the FVC further comprises:
a first inverter having an output connected to a gate of the transistor;
a second inverter having an output connected to an input of the first inverter;
a low pass filter (LPF) having a first end connected to an input of the second inverter at a first end and having a second end connected to the second SC circuit and to a second resistor.

32. The IC of claim 30, wherein the first SC circuit functions as one of: a pull-up resistor in the resistor divider circuit, a pull-down resistor in the resistor divider circuit or is between two resistive elements in series in the resistor divider circuit.

\* \* \* \* \*

UNITED STATES PATENT AND TRADEMARK OFFICE
CERTIFICATE OF CORRECTION

PATENT NO. : 11,256,288 B1
APPLICATION NO. : 17/164951
DATED : February 22, 2022
INVENTOR(S) : Matias Fernando Bulacio et al.

It is certified that error appears in the above-identified patent and that said Letters Patent is hereby corrected as shown below:

In the Specification

Column 2, Line 37 delete "example the" and replace with --example of the--.

Column 3, Line 57 delete "circuit" and replace with --circuit 210--.

Column 3, Line 59 delete "FIG. 1" and replace with --FIG. 2A--.

Column 3, Line 59 delete "clock monitor 20'" and replace with --clock monitor 20"--.

Column 3, Line 62 delete "monitor 20'" and replace with --monitor 20"--.

Column 4, Line 54 delete "CLK" and replace with --CLK1--.

Column 5, Line 12 delete "circuit 220" and replace with --circuit 210--.

Column 5, Line 47 delete "circuit 312' is" and replace with --circuit 312' (FIG. 4) is--.

Column 5, Line 48 delete "circuit 312" (FIG. 4)." and replace with --circuit 312".--.

Column 5, Line 52 delete "circuit 312'" and replace with --circuit 312",--.

Column 6, Line 27 delete "LPF 208'" and replace with --LPF 208"--.

Column 6, Line 31 delete "232'" and replace with --22.--.

Column 6, Line 52 delete "232"," and replace with --22.--.

Column 6, Line 64 delete "312*a*" and replace with --312'--.

Signed and Sealed this
    Seventh Day of March, 2023

Katherine Kelly Vidal
*Director of the United States Patent and Trademark Office*

CERTIFICATE OF CORRECTION (continued)
U.S. Pat. No. 11,256,288 B1

Column 6, Line 67 delete "312*a*" and replace with --312'--.

Column 7, Line 7 delete "210'" and replace with --210"--.

Column 7, Line 28 delete "fabricated operated" and replace with --fabricated and operated--.

Column 7, Line 41 delete "312*a*," and replace with --312*a*',--.

Column 7, Line 46 delete "inverter has" and replace with --inverter 806 has--.